US012804870B2

(12) United States Patent
Li

(10) Patent No.: US 12,804,870 B2
(45) Date of Patent: Nov. 17, 2026

(54) THERMAL AND/OR ELECTROMAGNETIC INTERFERENCE (EMI) MANAGEMENT COMPOSITES INCLUDING SILICONE CARBINOLS

(71) Applicant: Laird Technologies, Inc., Chesterfield, MO (US)

(72) Inventor: Yuqin Li, Cleveland, OH (US)

(73) Assignee: Laird Technologies, Inc., Chesterfield, MO (US)

( * ) Notice: Subject to any disclaimer, the term of this patent is extended or adjusted under 35 U.S.C. 154(b) by 519 days.

(21) Appl. No.: 18/427,243

(22) Filed: Jan. 30, 2024

(65) Prior Publication Data

US 2024/0268090 A1 Aug. 8, 2024

Related U.S. Application Data

(60) Provisional application No. 63/445,995, filed on Feb. 15, 2023, provisional application No. 63/443,691, filed on Feb. 6, 2023.

(51) Int. Cl.
*H05K 9/00* (2006.01)

(52) U.S. Cl.
CPC .................................. *H05K 9/0083* (2013.01)

(58) Field of Classification Search
None
See application file for complete search history.

(56) References Cited

U.S. PATENT DOCUMENTS

| | | | | |
|---|---|---|---|---|
| 3,304,259 | A | 2/1967 | Wright | |
| 4,842,753 | A | 6/1989 | Mori et al. | |
| 5,100,568 | A | 3/1992 | Takahashi et al. | |
| 5,227,081 | A | 7/1993 | Sawa et al. | |
| 7,592,383 | B2 | 9/2009 | Fukui | |
| 7,695,817 | B2 | 4/2010 | Lin et al. | |
| 7,786,056 | B2 | 8/2010 | Matsumoto et al. | |
| 8,334,592 | B2 | 12/2012 | Bhagwagar et al. | |
| 8,541,531 | B2 | 9/2013 | Dershem | |
| 8,618,211 | B2 | 12/2013 | Bhagwagar et al. | |
| 9,481,851 | B2 | 11/2016 | Matsumoto et al. | |
| 2005/0110133 | A1 | 5/2005 | Yamada et al. | |
| 2005/0261140 | A1 | 11/2005 | Yamada et al. | |
| 2007/0042533 | A1 | 2/2007 | Endo et al. | |
| 2007/0149834 | A1 | 6/2007 | Endo et al. | |
| 2010/0275440 | A1 | 11/2010 | Paisner et al. | |
| 2010/0328895 | A1* | 12/2010 | Bhagwagar | H10W 40/251 228/256 |
| 2012/0280169 | A1 | 11/2012 | Kato et al. | |
| 2014/0146477 | A1 | 5/2014 | Youn | |
| 2019/0085167 | A1* | 3/2019 | Iwata | C09D 183/04 |
| 2020/0287253 | A1 | 9/2020 | Strader et al. | |
| 2020/0347315 | A1* | 11/2020 | Iwata | C08L 83/04 |
| 2021/0115252 | A1* | 4/2021 | Toya | C08K 3/04 |
| 2022/0056270 | A1 | 2/2022 | Mondal et al. | |

FOREIGN PATENT DOCUMENTS

| | | | |
|---|---|---|---|
| CN | 114437546 | A | 5/2022 |
| EP | 0501380 | A2 | 9/1992 |
| JP | 2938428 | B1 | 8/1999 |
| JP | 2005099575 | A | 4/2005 |
| JP | 2012149155 | A | 8/2012 |
| JP | 202281264 | A | 5/2022 |
| JP | 202312918 | A | 1/2023 |
| KR | 10-2013-0022015 | A | 3/2013 |

OTHER PUBLICATIONS

Japanese office action for JP2024-015591 that claims priority to the instant application; May 14, 2025; 10 pages.
European Search Report for EP24155077.1 that claims priority to the instant application; dated Jun. 17, 2024, 6 pages.
Japanese Office Action for JP2025-148706 that claims priority to the same parent application as the instant application, dated Aug. 18, 2026, 4 pages.

* cited by examiner

*Primary Examiner* — Robert S Jones, Jr.
*Assistant Examiner* — Lily K Sloan
(74) *Attorney, Agent, or Firm* — Harness, Dickey & Pierce, P.L.C.; Anthony G. Fussner

(57) ABSTRACT

The present disclosure relates to the use of silicone carbinols as components in composites, such as polymer-inorganic composites useful for the management of heat and/or electromagnetic interference (EMI) and other polymer-inorganic composites used for other purposes. In exemplary embodiments, silicone carbinol is added to a composite in an amount sufficient for increasing flow rate of the composite. The increased flow rate of the composite enables a useful increase in functional filler content, which, in turn, allows increased benefits related to performance. For example, functional filler loadings/particle concentrations may be increased in a thermal and/or EMI management material for higher thermal and/or electrical conductivity as the silicone carbinol helps to retain a desired dispensing flow rate for the composite despite the higher functional filler loadings/particle concentrations in the composite.

23 Claims, No Drawings

THERMAL AND/OR ELECTROMAGNETIC INTERFERENCE (EMI) MANAGEMENT COMPOSITES INCLUDING SILICONE CARBINOLS

CROSS-REFERENCE TO RELATED APPLICATIONS

This application claims the benefit of and priority to U.S. Provisional Application No. 63/445,995 filed Feb. 15, 2023 and to U.S. Provisional Application No. 63/443,691 filed Feb. 6, 2023. The entire disclosures of the above applications are incorporated herein by reference.

FIELD

The present disclosure relates to the use of silicone carbinols as components in polymer-inorganic composite materials useful for the management of heat and/or electromagnetic interference (EMI).

BACKGROUND

This section provides background information related to the present disclosure which is not necessarily prior art.

Electrical components, such as semiconductors, integrated circuit packages, transistors, etc., typically have pre-designed temperatures at which the electrical components optimally operate. Ideally, the pre-designed temperatures approximate the temperature of the surrounding air. But the operation of electrical components generates heat. If the heat is not removed, the electrical components may then operate at temperatures significantly higher than their normal or desirable operating temperature. Such excessive temperatures may adversely affect the operating characteristics of the electrical components and the operation of the associated device.

To avoid or at least reduce the adverse operating characteristics from the heat generation, the heat should be removed, for example, by conducting the heat from the operating electrical component to a heat sink. The heat sink may then be cooled by conventional convection and/or radiation techniques. During conduction, the heat may pass from the operating electrical component to the heat sink either by direct surface contact between the electrical component and heat sink and/or by contact of the electrical component and heat sink surfaces through an intermediate medium or thermal interface material (TIM). The thermal interface material may be used to fill the gap between thermal transfer surfaces, in order to increase thermal transfer efficiency as compared to having the gap filled with air, which is a relatively poor thermal conductor.

In addition, a common problem in the operation of electronic devices is the generation of electromagnetic radiation within the electronic circuitry of the equipment. Such radiation may result in electromagnetic interference (EMI) or radio frequency interference (RFI), which can interfere with the operation of other electronic devices within a certain proximity. Without adequate shielding, EMI/RFI interference may cause degradation or complete loss of important signals, thereby rendering the electronic equipment inefficient or inoperable.

A common solution to ameliorate the effects of EMI/RFI is through the use of shields capable of absorbing and/or reflecting and/or redirecting EMI energy. These shields are typically employed to localize EMI/RFI within its source, and to insulate other devices proximal to the EMI/RFI source. These shields may be composed of metal, polymer-inorganic composites, filled foams, foam materials wrapped or coated with absorbing and/or reflecting materials, and the like.

The term "EMI" as used herein should be considered to generally include and refer to EMI emissions and RFI emissions, and the term "electromagnetic" should be considered to generally include and refer to electromagnetic and radio frequency from external sources and internal sources. Accordingly, the term shielding (as used herein) broadly includes and refers to mitigating (or limiting) EMI and/or RFI, such as by absorbing, reflecting, blocking, and/or redirecting the energy or some combination thereof so that it no longer interferes, for example, for government compliance and/or for internal functionality of the electronic component system.

The above mitigation/management materials, if not comprised of metal, often consist of inorganic-polymer composites or metal-polymer composites. The concentration of the inorganic material, which is usually a particle, in the polymer matrices is often high, for the purpose of attaining the desired management of thermal and/or EMI issues.

In some instances, the composites are dispensable materials, such as thermal gels, putties, and greases. Conventional thermal gels/putties are limited to use within large gaps (constant gap) due to the large particle sizes used in the formulation in order to achieve high thermal conductivity. In contrast, conventional thermal greases are limited to use within small gaps under continuous pressure due to the tendency of the conventional thermal grease to slip out from the gap in the vertical position.

In addition, the composites may be used in applications where they are compressed between two portions of the device requiring management of thermal and/or EMI issues. This compression may occur during the assembly of a device or during cycles of compression and expansion during use of a device. As a result, the composites must be 'soft' so they can readily deflect and absorb the forces of compression, without transferring those forces to the device being protected with the associated risk of physical damage. As is known to those skilled in the art, in some situations the methods used to prepare such soft composites lead to materials from which various organic species may migrate over time, particularly after repeated cycles of compression and expansion. These organic species may consist of polymers, monomers, additives used to form the composite or to enhance its performance during use, complexes of organic materials with inorganic materials, and the like. The term 'oil bleed' is commonly used within the industry to describe this phenomenon, and will be used in this document with the understanding that 'oil' refers to a range of primarily organic species and 'bleed' refers to the movement of materials from within the composites to a location, or locations, external to the composites.

DETAILED DESCRIPTION

Example embodiments will now be described more fully with reference to the accompanying drawings.

Disclosed herein are innovative methods of using silicone carbinols as components in composites that provide an unexpected increase in the flow rate of the composites, such as polymer-inorganic composites useful for the management of heat and/or electromagnetic interference (EMI) and polymer-inorganic composites used for other purposes. The inventor has discovered the unexpected and previously unknown benefit of inclusion of silicone carbinol in such composites as alternatives to conventional PDMS fluids, and as alternatives to commonly-used dispersing agents.

As experimentally demonstrated in liquid gap filler compositions (e.g., see Table 1 below, etc.), the use of silicone carbinol fluids provides an unexpected increase in flow rate, enabling a useful increase in functional filler content, which, in turn, allows increased benefits related to performance. Particle concentrations may be increased while retaining the desired dispensing flow rates.

For example, functional filler loadings/particle concentrations may be increased in a composite for higher thermal and/or electrical conductivity as the silicone carbinol helps to retain a desired dispensing flow rate for the composite despite the higher functional filler loadings/particle concentrations in the composite. By increasing the flow rate of the composite, the silicone carbinol thereby enables, accommodates, and/or compensates for the higher functional filler loadings/particle concentrations that would otherwise reduce the flow rate of the composite Polymer-inorganic composite materials provide valuable options to control the effect of heat and electromagnetic radiation in electronic systems. Many of the composites require the inclusion of inorganic fillers at high concentrations in a polymer or other organic matrix to attain the desired properties. A key challenge in such systems is to ensure adequate flow within the composite, and of the bulk composite, to ensure effective deflection of solid materials under applied force, to ensure effective flow rates of liquid composite, and the like.

The inventor has discovered that the inclusion of a hydrocarbyl functional organopolysiloxane (broadly, silicone carbinol), in particular where the hydrocarbyl group has the formula:

$$—R_2—O—R_1—CH2OH,$$

$R_2$ can have aliphatic structure with 1-6 carbon or have aromatic structure, $R_1$ can be linear or branched aliphatic chain with the number of carbon from 1 to 12, a branched structure that can have carbinol groups, or $R_1$ can be an aromatic structure with carbinol groups. Carbinol group does not need to be present initially as long as a precursor that can lead to a carbinol group, such as epoxide group, exists. This results in thermal and/or EMI management compositions with unique properties. In particular, the use of materials with hydrocarbyl functional organopolysiloxanes enables the attainment of unexpected high flow properties even at high particle concentrations.

Table 1 below includes experimental results for TIM liquid gap filler formulations including PDMS fluids, aluminum, zinc oxide, and silicone carbinol showing the unexpected increase in flow rate by the addition of the silicone carbinol. These experimental results have shown the positive impact on flow rate by adding silicone carbinol to a formulation. More specifically, Table 1 includes compelling data in these demonstration systems that primarily were PDMS fluid+fillers+filler dispersing agent (+optional colorants and antioxidants). In these examples, "PDMS" is short-hand for the PDMS fluid+fillers+filler dispersing agent (+optional colorants and antioxidants). As shown by Example 1, the formulation with the silicone carbinol revealed the surprising benefit of a higher (desirable) flow rate of 166.9 g/min as compared to the 74.9 g/min flow rate of the control formulation that included silanol but not any silicone carbinol. The formulations of Example 2 revealed the surprising benefit related to flow as a function of loading as higher flow rates were achieved by the formulations with the higher percentage of carbinol siloxane (broadly, silicone carbinol). Example 3 revealed that comparable flow rates of 101 g/min and 102 g/min were achieved for both formulations that respectively included silicone monocarbinol or silicone bicarbinol. Silicone dicarbinols (carbinol groups at each end) are expected to provide similar benefits. Dispersing agents usually provide beneficial reductions in viscosity only to a certain extent, assumed to be based on the amount of dispersing agent that can bind to the particle surface. The addition of additional dispersing agent does not significantly reduce the viscosity, and often causes a slight increase in the viscosity of a dispersion. The inventor found an unexpected result: continued addition of carbinol siloxanes provide a beneficial reduction in flow rate.

TABLE 1

| | All formulations loaded with aluminum and zinc oxide and further including: | Flow Rate Grams per Minute (g/min) |
|---|---|---|
| Example 1 | Silanol | 74.9 |
| | Silicone Carbinol | 166.9 |
| Example 2 | 4:2.1 Ratio of PDMS to Carbinol Polysiloxane | 30.6 |
| | 3.5:2.6 Ratio of PDMS to Carbinol Polysiloxane | 63 |
| | 3:3.1 Ratio of PDMS to Carbinol Polysiloxane | 100 |
| | 2.5:3.6 Ratio of PDMS to Carbinol Polysiloxane | 102 |
| Example 3 | 3:3.1 Ratio of PDMS to Silicone Monocarbinol | 101 |
| | 3:3.1 Ratio of PDMS to Silicone Bicarbinol | 102 |

Although the experimental results shown in Table 1 above were obtained for TIM liquid gap filler formulations, the same benefit of increased flow rate is expected when silicone carbinol is added to liquid gap fillers containing not only thermally-conductive materials, but also absorbers, and containing mixtures of absorbers and thermally-conductive particles. In addition, this invention will have broad utility as the silicone carbinol class of materials likely interacts with the surface of the fillers in the system in a way that is strong enough to have a beneficial effect. As a result, this invention should have wide applicability to a wide range of formulated products used for the control of thermal and/or electromagnetic properties of materials, in which it is desirable to have an increased flow rate, enabling a useful increase in functional filler content, which, in turn, allows increased benefits related to performance.

This unexpected and previously unknown benefit of the inclusion of silicone carbinol is not limited solely to dispensable liquid gap filler compositions but is also applicable to other compositions, such as compositions of gap filler pads, etc. In cases where a PDMS fluid is part of the composition of a gap filler pad, for example, to soften the composition, the carbinol fluids will work more effectively. The carbinol fluids also will act as effective particle dispersants in such systems, even in the absence of a PDMS fluid. The carbinol fluids also will act to reduce migration of materials (e.g., oil bleed, etc.) in such systems, even in the absence of a PDMS fluid, because the carbinol fluids will have interaction with the fillers and will reduce the migration of multiple species. The substitution of silicone carbinol for 10% of the PDMS fluid used in Tflex 900 gap filler pad containing PDMS fluid, resulted in a decrease in the average Shore 00 hardness from 77 to 66. Accordingly, this invention should also have wide applicability to a wide range of formulated products used for the control of thermal and electromagnetic properties of materials, in which it is undesirable to have migration of organic species within the composite to locations external to the composite.

In exemplary embodiments, silicone carbinol is added in a sufficient amount such that the resulting thermal and/or EMI management material has the following advantageous characteristics: increased flow rate and reduced or undetectable migration of materials (e.g., oil bleed, etc.) as compared to a thermal and/or EMI management material having the same formulation but without the silicone carbinol. In addition to having an increased flow rate and decreased migration of materials, the composite may also be configured to have or include one or more (but not necessarily any or all) of the following features in exemplary embodiments disclosed herein:

- dispensable across all or numerous TIM applications on a board/system;
- maintain reliability as a gap filler in constant gaps up to 2 millimeters (mm);
- deflect to a minimum bondline of less than 50 micrometers, e.g., for high power components in constant pressure applications;
- all-in-one dispensable that is usable in minimum bondline constant pressure applications (as a grease) and usable as a thick gap filler in a constant gap up to 2 mm (as a dispensable gap filler/gel/putty);
- simplify operations by consolidating thermal and/or EMI management materials and increase throughput by enabling the dispensing of only one material instead of multiple materials or placing pads;
- a single composite usable for both constant gap and constant pressure application with extremely low thermal resistance;
- good pump out resistance and vertical stability in one product;
- with silicone carbinol, the reliability or durability under high temperature and/or high humidity is improved; and
- with silicone carbinol, the shelf life can be extended, material can remain good fluidity/workability for extended amount of time.

High flow rate is one goal that is achievable with the addition of silicone carbinol but high performance is also important. For example, a pad material including a silicone-based matrix may achieve a relatively high thermal conductivity. By comparison, the same pad material with silicone carbinol added to the matrix may achieve a higher thermal conductivity due to a higher thermally-conductive filler loading while maintaining a similar flow rate and/or or similar hardness/deflection of the pad material.

As noted above, the silicone carbinol will act to reduce migration of materials (e.g., oil bleed, etc.) because the silicone carbinol will have interaction with the fillers and will reduce the migration of multiple species. This is significant in that oil bleed is a concern for aesthetic reasons as well as due to the potential contamination of optics in electronic applications (e.g., optical transceivers, camera lenses, etc.). High speed signal lines may also be affected by oil bleed. Accordingly, it is desirable to decrease and/or prevent migration of materials, such as silicone oil bleed, from polymer-inorganic composites used to manage/mitigate thermal and/or EMI issues in devices.

It is, however, challenging to balance the preparation of a highly-loaded polymer composite for use as a thermal and/or EMI management material that has the ability to fulfill the desired thermal and/or EMI management/mitigation requirements and other requirements while also readily deflecting under low levels of applied force. In these materials, oil bleed may result for multiple reasons. For example, conventional thermal and/or EMI management materials are commonly based on the use of silicone polymers. Silicone polymers typically contain a wide distribution of molecular weight (MW) polymers. It is commonly assumed that some of the polymer with low molecular weights are capable of migration in the matrix to such an extent that the migrated polymer materials become visibly apparent beyond the confines of the composite, thereby resulting in undesirable aesthetics. Other additives in the composite in addition to the silicone polymers, such as dispersing agents, stabilizing agents (e.g., UV stabilizers, thermal stabilizers, etc.) and the like, may also migrate. Composites that use polymers that are not based on silicone materials also contain species capable of migration, and face similar challenges are described above for representative silicone-based systems.

Accordingly, the use of silicone carbinols can also help to solve the problem of how to prepare highly loaded polymer composites with the ability to readily deflect under low levels of applied force and without the undesirable migration or bleed of materials from the composite to surrounding areas. In addition to increasing flow rate of the composite, the silicone carbinol can therefore also provide a way to reduce the migration of more mobile materials in the composite.

As compared to a thermal and/or electromagnetic interference (EMI) management material having the silicone carbinol additive, a thermal and/or electromagnetic interference (EMI) management material having the same formulation without the silicone carbinol additive will have a lower (less desirable) flow rate and a tendency to bleed significantly more, which can result in aesthetic and performance issues in electronic applications. Though conventional methods exist to reduce bleed from thermal and/or electromagnetic interference (EMI) management materials (e.g., a TIM, etc.), such conventional methods often have been found to significantly increase hardness such that the harder material is not able to readily deflect under low levels of applied force. Accordingly, exemplary embodiments are disclosed herein in which silicone carbinol additive is added to a formulation for a thermal and/or electromagnetic interference (EMI) management material to increase flow rate and reduce bleed without detrimentally changing other desired properties (e.g., flexibility, thermal conductivity, electrical conductivity, etc.) of the thermal and/or electromagnetic interference (EMI) management material.

In exemplary embodiments, the composite includes functional filler(s) (e.g., at least about 25 wt %, at least about 80 wt %, at least about 90 wt %, etc.) in the matrix or base material (e.g., a silicone-based polymer resin, a non-silicone-based polymer resin, etc.) for increasing thermal conductivity and/or for EMI absorption. The functional fillers may comprise thermally-conductive filler(s), electrically-conductive filler(s), electromagnetic wave absorbing filler(s), dielectric absorbing filler(s), and filler(s) that has two or more properties of being thermally conductive, electrically conductive, dielectric absorbing, and electromagnetic wave absorbing. Example functional fillers include stainless steel, diamond, carbon black, boron nitride, nickel cobalt, carbonyl iron, iron silicide, iron particles, iron-chrome compounds, silver, an alloy containing 85% iron, 9.5% silicon and 5.5% aluminum, an alloy containing about 20% iron and 80% nickel, ferrites, magnetic alloys, magnetic powders, magnetic flakes, magnetic particles, nickel-based alloys and powders, chrome alloys, oxide, copper, zinc oxide, alumina, graphite, ceramics, silicon carbide, manganese zinc, fiberglass, carbon nanotubes (e.g., single-walled carbon nanotubes, multi-walled carbon nanotubes, etc.), thermally-conductive materials including metal composites (e.g., gallium and gallium alloys, etc.) having melting points near or below room temperature, combinations thereof, etc.

By way of example, the composite may include less than about 10 weight percent of matrix or base material, containing a range of concentrations of silicone carbinol from 1 weight percent or less to embodiments in which the majority of the matrix may be comprised of silicone carbinol, and at least about 90 weight percent of functional filler. In other exemplary embodiments, the composite may include different weight percentages of the silicone carbinol, such as about 10 weight % or less, from about 5 to 10 weight %, from about 0.1 to 2 weight %, etc. The composite may also include different weight percentages of matrix or base material (e.g., about 7 weight %, about 8 weight %, more than 10 weight %, etc.) and/or different weight percentages of functional filler (e.g., about 25 weight % or more, at least about 80 weight % but less than 90 weight %, more than 90 weight %, etc.).

In exemplary embodiments, the composite including the silicone carbinol may be in the form of a thermally-conductive pad having a rectangular shape. Alternatively, the thermally-conductive pad may have a different shape, such as a different polygonal shape (e.g., pentagonal, triangular, etc.). In alternative embodiments, the composite including the silicone carbinol may comprise a dispensable material, a thermal grease, a bulk putty, a phase change TIM, etc.

Disclosed herein are exemplary methods for increasing flow rate of a composite and/or for decreasing migration of materials (e.g., silicone oil bleed, etc.) from composites, such as thermal and/or electromagnetic interference (EMI) management materials (e.g., thermal interface materials (TIMs), EMI absorbers, thermally-conductive EMI absorbers, electrically-conductive elastomers (ECEs), electrically-conductive composites, combinations thereof, etc.) and polymer-inorganic composites used for other purposes.

In exemplary embodiments, a method comprises adding silicone carbinol to a composite in an amount sufficient for increasing flow rate of the composite and/or for decreasing migration of materials from the composite. The composite may comprise a composite useful for the management of heat and/or electromagnetic interference (EMI). In exemplary embodiments, the method may include using carbinol PDMS fluid not as a filler dispersant but at a higher level as a key part of the matrix.

In exemplary embodiments, the method includes adding silicone carbinol to the composite such that the composite contains a concentration of the silicone carbinol within a range of concentrations of the silicone carbinol from 1 weight percent or less or in which the majority of the matrix is comprised of the silicone carbinol. The silicone carbinol may comprise part of a mixture as another agent in the mixture, which together may help with viscosity, flow rate, and thermal characteristics.

In exemplary embodiments, a method includes increasing flow rate of a composite by adding silicone carbinol to the composite, thereby enabling a useful increase in filler content in the composite for performance improvement.

In exemplary embodiments, a method includes adding silicone carbinol to a composite in an amount sufficient for both increasing flow rate of the composite and decreasing migration of materials from the composite, wherein the composite is useful for the management of heat and/or electromagnetic interference (EMI).

In exemplary embodiments, the silicone carbinol comprises hydrocarbyl functional organopolysiloxane. The hydrocarbyl functional organopolysiloxane may include a hydrocarbyl group having the formula of R2OCH2CH2OH where R2 is a divalent hydrocarbon group containing 2 to 6 carbon atoms.

In exemplary embodiments, the composite is a polydimethylsiloxane (PDMS)-based polymer-inorganic composite.

In exemplary embodiments, adding the silicone carbinol to the composite comprises adding carbinol siloxane to the composite.

In exemplary embodiments, adding the silicone carbinol to the composite comprises adding silicone carbinol fluid to the composite in an amount sufficient to act as an effective particle dispersant in the composite.

In exemplary embodiments, the composite includes the silicone carbinol, aluminum, and zinc oxide within a matrix comprising polydimethylsiloxane (PDMS).

In exemplary embodiments, the silicone carbinol comprises carbinol polysiloxane within a matrix comprising polydimethylsiloxane (PDMS) such that a ratio of the PDMS to the carbinol polysiloxane is about 3:3.1, about 2.5:3.6, or about 1:1 or less.

In exemplary embodiments, the silicone carbinol comprises silicone monocarbinol and/or bicarbinol and/or dicarbinol within a matrix comprising polydimethylsiloxane (PDMS) such that a ratio of the PDMS to the silicone monocarbinol and/or bicarbinol and/or dicarbinol is about 3:3.1 or less. By way of example only, exemplary embodiments may include silicone monocarbinol that comprises a hydroxy material having a molecular weight (Mn) of 1,000 and viscosity of 10-25 millipascal-second (mPa·s), or molecular weight (Mn) of 5,000 and viscosity of 60-80 mPA·s, or a molecular weight (Mn) of 10,000 and viscosity of 140-180 mPA·s, etc. By way of further example only, exemplary embodiments may include silicone dicarbinol that comprises a hydroxy(diol) material having a molecular weight (Mn) of 1,000 and viscosity of 50-70 millipascal-second (mPa·s), or molecular weight (Mn) of 5,000 and viscosity of 80-160 mPA·s, or a molecular weight (Mn) of 15,000 and viscosity of 300-700 mPA·s, etc.

In exemplary embodiments, the silicone carbinol is in an amount sufficient to reduce silicone oil bleed from the composite thereby enabling the composite to be usable substantially or entirely without silicone migration beyond confines of the composite.

In exemplary embodiments, the composite is a polymer-inorganic composite substantially free of siloxane polymers.

In exemplary embodiments, the method further comprises adding one or more of the following to the composite: thermally-conductive filler(s); electrically-conductive filler(s); electromagnetic wave absorbing filler(s); dielectric absorbing filler(s); and filler(s) that has two or more properties of being thermally conductive, electrically conductive, dielectric absorbing, and electromagnetic wave absorbing.

In exemplary embodiments, the composite has a mass flow rate of at least about 100 grams per minute (g/min) or higher.

In exemplary embodiments, the composite is a thermal and/or electromagnetic interference (EMI) management material usable for managing thermal and/or electromagnetic properties of a device or system.

In exemplary embodiments, the composite is a thermal interface material, an EMI absorber, a thermally-conductive absorber, an electrically-conductive elastomer, an electrically-conductive composite, or a combination of two or more thereof.

In exemplary embodiments, the method includes using the composite for managing thermal and/or electromagnetic properties of a device or system.

In exemplary embodiments, the composite is deflectable to a minimum bondline of less than about 50 micrometers.

In exemplary embodiments, the composite is a liquid gap filler composite including silicone carbinol fluid.

In exemplary embodiments, the method includes dispensing the composite onto a surface of a device for managing thermal and/or electromagnetic properties of the device or a system including the device.

In exemplary embodiments, the composite is in the form of a gap filler pad. The gap filler pad may be configured to be usable within a gap up to about 2 millimeters. And the composite may comprise polydimethylsiloxane (PDMS) fluid. In such exemplary methods, the step of adding the silicone carbinol to the composite may comprise adding silicone carbinol fluid to the PDMS fluid in an amount sufficient to enable the silicone carbinol fluid to act as an effective particle dispersant in the composite.

In exemplary embodiments, a composite comprises silicone carbinol in an amount sufficient for increasing flow rate of the composite and/or for decreasing migration of materials from the composite. The composite may comprise a composite useful for the management of heat and/or electromagnetic interference (EMI). The composite may comprise a composite useful for the management of heat and/or electromagnetic interference (EMI).

In exemplary embodiments, the composite includes carbinol PDMS fluid that is not used as a filler dispersant but is at a higher level as a key part of the matrix.

In exemplary embodiments, the composite contains a concentration of the silicone carbinol within a range of concentrations of the silicone carbinol from 1 weight percent or less or in which the majority of the matrix is comprised of the silicone carbinol. The silicone carbinol may comprise part of a mixture as another agent in the mixture, which together may help with viscosity, flow rate, and thermal characteristics.

In exemplary embodiments, a composite includes silicone carbinol in an amount sufficient to increase flow rate of the composite thereby enabling a useful increase in filler content in the composite for performance improvement.

In exemplary embodiments, a composite includes silicone carbinol in an amount sufficient for both increasing flow rate of the composite and decreasing migration of materials from the composite, wherein the composite is useful for the management of heat and/or electromagnetic interference (EMI).

In exemplary embodiments, the silicone carbinol comprises hydrocarbyl functional organopolysiloxane. The hydrocarbyl functional organopolysiloxane may include a hydrocarbyl group having the formula of R2OCH2CH2OH where R2 is a divalent hydrocarbon group containing 2 to 6 carbon atoms.

In exemplary embodiments, the composite is a polydimethylsiloxane (PDMS)-based polymer-inorganic composite.

In exemplary embodiments, the silicone carbinol comprises carbinol siloxane.

In exemplary embodiments, the silicone carbinol comprises silicone carbinol fluid in an amount sufficient to act as an effective particle dispersant in the composite.

In exemplary embodiments, the composite includes the silicone carbinol, aluminum, and zinc oxide within a matrix comprising polydimethylsiloxane (PDMS).

In exemplary embodiments, the silicone carbinol comprises carbinol polysiloxane within a matrix comprising polydimethylsiloxane (PDMS) such that a ratio of the PDMS to the carbinol polysiloxane is about 3:3.1, about 2.5:3.6, or about 1:1 or less.

In exemplary embodiments, the silicone carbinol comprises silicone monocarbinol and/or bicarbinol and/or dicarbinol within a matrix comprising polydimethylsiloxane (PDMS) such that a ratio of the PDMS to the silicone monocarbinol and/or bicarbinol and/or dicarbinol is about 3:3.1 or less. By way of example only, exemplary embodiments may include silicone monocarbinol that comprises a hydroxy material having a molecular weight (Mn) of 1,000 and viscosity of 10-25 millipascal-second (mPa·s), or molecular weight (Mn) of 5,000 and viscosity of 60-80 mPA·s, or a molecular weight (Mn) of 10,000 and viscosity of 140-180 mPA·s, etc. By way of further example only, exemplary embodiments may include silicone dicarbinol that comprises a hydroxy(diol) material having a molecular weight (Mn) of 1,000 and viscosity of 50-70 millipascal-second (mPas), or molecular weight (Mn) of 5,000 and viscosity of 80-160 mPA·s, or a molecular weight (Mn) of 15,000 and viscosity of 300-700 mPA·s, etc.

In exemplary embodiments, the silicone carbinol is in an amount sufficient to reduce silicone oil bleed from the composite thereby enabling the composite to be usable substantially or entirely without silicone migration beyond confines of the composite.

In exemplary embodiments, the composite is a polymer-inorganic composite substantially free of siloxane polymers.

In exemplary embodiments, the composite further comprises adding one or more of the following to the composite: thermally-conductive filler(s); electrically-conductive filler (s); electromagnetic wave absorbing filler(s); dielectric absorbing filler(s); and filler(s) that has two or more properties of being thermally conductive, electrically conductive, dielectric absorbing, and electromagnetic wave absorbing.

In exemplary embodiments, the composite has a mass flow rate of at least about 100 grams per minute (g/min) or higher.

In exemplary embodiments, the composite is a thermal and/or electromagnetic interference (EMI) management material usable for managing thermal and/or electromagnetic properties of a device or system.

In exemplary embodiments, the composite is a thermal interface material, an EMI absorber, a thermally-conductive absorber, an electrically-conductive elastomer, an electrically-conductive composite, or a combination of two or more thereof.

In exemplary embodiments, the composite is configured to be usable for managing thermal and/or electromagnetic properties of a device or system.

In exemplary embodiments, the composite is deflectable to a minimum bondline of less than about 50 micrometers.

In exemplary embodiments, the composite is a liquid gap filler composite including silicone carbinol fluid.

In exemplary embodiments, the composite is dispensable onto a surface of a device for managing thermal and/or electromagnetic properties of the device or a system including the device.

In exemplary embodiments, the composite is in the form of a gap filler pad. The gap filler pad may be configured to be usable within a gap up to about 2 millimeters. And the composite may comprise polydimethylsiloxane (PDMS) fluid. The composite may include silicone carbinol fluid in an amount sufficient to enable the silicone carbinol fluid to act as an effective particle dispersant in the composite.

In exemplary embodiments, a device or system comprising a composite as disclosed herein that is used for managing thermal and/or electromagnetic properties of the device or system.

In exemplary embodiments, one or more of the following are added to the composite: thermally-conductive filler(s), electrically-conductive filler(s), electromagnetic wave absorbing filler(s), dielectric absorbing filler(s), and filler(s) that has two or more properties of being thermally conductive, electrically conductive, dielectric absorbing, and electromagnetic wave absorbing. For example, the method may include adding one or more of the following to the composite: stainless steel, diamond, carbon black, boron nitride, nickel cobalt, carbonyl iron, iron silicide, iron particles, iron-chrome compounds, silver, an alloy containing 85% iron, 9.5% silicon and 5.5% aluminum, an alloy containing about 20% iron and 80% nickel, ferrites, magnetic alloys, magnetic powders, magnetic flakes, magnetic particles, nickel-based alloys and powders, chrome alloys, oxide, copper, zinc oxide, alumina, graphite, ceramics, silicon carbide, manganese zinc, fiberglass, carbon nanotubes (e.g., single-walled carbon nanotubes, multi-walled carbon nanotubes, etc.), thermally-conductive materials including metal composites (e.g., gallium and gallium alloys, etc.) having melting points near or below room temperature, combinations thereof, etc.

In an exemplary embodiment, an electronic device includes a heat source and a composite as disclosed herein. The composite is positioned relative to the heat source for establishing at least a portion of a thermally-conductive heat path from the heat source through the composite. The composite includes silicone carbinol in an amount sufficient to increase flow rate of the composite. The silicone carbinol may also decrease migration of materials (e.g., silicone oil bleed, etc.) from the composite onto the heat source. The composite may be configured to be EMI absorbing and/or electrically conductive, such that the composite is also operable for mitigating and/or managing EMI within the electronic device.

In an exemplary embodiment, an electronic device includes a heat source, a heat removal/dissipation structure, and a composite as disclosed herein. The composite is positioned relative to the heat source and the heat removal/dissipation structure for establishing at least a portion of a thermally-conductive heat path between the heat source and the heat removal/dissipation structure. The composite includes silicone carbinol in an amount sufficient to increase flow rate of the composite. The silicone carbinol may also decrease migration of materials (e.g., silicone oil bleed, etc.) from the composite onto the heat source and the heat removal/dissipation structure. The composite may be configured to be EMI absorbing and/or electrically conductive, such that the composite is also operable for mitigating and/or managing EMI within the electronic device.

In an exemplary embodiment, an electronic device includes a heat source, a board level shield, and a composite as disclosed herein. The composite is positioned relative to the heat source and the board level shield for establishing at least a portion of a thermally-conductive heat path between the heat source and the board level shield. The composite includes silicone carbinol in an amount sufficient to increase flow rate of the composite. The silicone carbinol may also decrease migration of materials (e.g., silicone oil bleed, etc.) from the composite onto the heat source and the board level shield. The composite may be configured to be EMI absorbing and/or electrically conductive, such that the composite is also operable for mitigating and/or managing EMI within the electronic device.

In an exemplary embodiment, an electronic device includes a heat source, a board level shield, a heat removal/dissipation structure, and first and second composites as disclosed herein. The first composite is positioned relative to the heat source and the board level shield for establishing at least a portion of a first thermally-conductive heat path between the heat source and the board level shield. The first composite includes silicone carbinol in an amount sufficient to increase flow rate of the first composite. The silicone carbinol may also decrease migration of materials (e.g., silicone oil bleed, etc.) from the first composite onto the heat source and the board level shield. The second composite is positioned relative to the board level shield and the heat removal/dissipation structure for establishing at least a portion of a second thermally-conductive heat path between the board level shield and the heat removal/dissipation structure. The second composite includes silicone carbinol in an amount sufficient to increase flow rate of the second composite. The silicone carbinol may also decrease migration of materials (e.g., silicone oil bleed, etc.) from the second composite onto the board level shield and the heat removal/dissipation structure. The first and/or second composites may be configured to be EMI absorbing and/or electrically conductive, such that the first and/or second composites are also operable for mitigating and/or managing EMI within the electronic device.

In an exemplary embodiment, an electronic device includes an integrated circuit, a board level shield, a heat sink, and first and second composites as disclosed herein. The first composite is positioned relative to the integrated circuit and the board level shield for establishing at least a portion of a first thermally-conductive heat path between the integrated circuit and the board level shield. The first composite includes silicone carbinol in an amount sufficient to increase flow rate of the first composite. The silicone carbinol may also decrease migration of materials (e.g., silicone oil bleed, etc.) from the first composite onto the integrated circuit and the board level shield. The second composite is positioned relative to the board level shield and the heat sink for establishing at least a portion of a second thermally-conductive heat path between the board level shield and the heat sink. The second composite includes silicone carbinol in an amount sufficient to increase flow rate of the second composite. The silicone carbinol may also decrease migration of materials (e.g., silicone oil bleed, etc.) from the second composite decrease migration of materials (e.g., silicone oil bleed, etc.) from the second composite onto the board level shield and the heat sink. The first and/or second composites may be configured to be EMI absorbing and/or electrically conductive, such that the first and/or second composites are also operable for mitigating and/or managing EMI within the electronic device.

In addition to silicone carbinol, one or more other suitable fillers and/or additives may also be added to a bulk material for a thermal and/or EMI management material or a polymer-inorganic composite used for other purpose(s). For example, one or more of the following may also be added: functional nanoparticles, electrically-conductive fillers, thermally-conductive fillers, EMI or microwave absorbing fillers, magnetic fillers, coated fillers, catalyst for controlling curing, coupling agent for increasing filler loading, pigment or dye for adding color, plasticizers, process aids, flame retardants, extenders, tackifying agents, antioxidants, ultraviolet (UV) stabilizers, thermal stabilizers, combinations thereof, etc. Filler(s) may be added and mixed into a bulk material including the matrix or base material and the thereby provide a mixture of the filler(s), silicone carbinol additive, and matrix or base material. Example fillers include stainless steel, diamond, carbon black, boron nitride, nickel cobalt, carbonyl iron, iron silicide, iron particles, iron-chrome compounds, silver, an alloy containing 85% iron, 9.5% silicon and 5.5% aluminum, an alloy containing about 20% iron and 80% nickel, ferrites, magnetic alloys, magnetic powders, magnetic flakes, magnetic particles, nickel-based alloys and powders, chrome alloys, oxide, copper, zinc oxide, alumina, graphite, ceramics, silicon carbide, manganese zinc, fiberglass, carbon nanotubes (e.g., single-walled carbon nanotubes, multi-walled carbon nanotubes, and/or carbon nanostructures, etc.), thermally-conductive materials including metal composites (e.g., gallium and gallium alloys, etc.) having melting points near or below room temperature, combinations thereof, etc. The filler(s) may comprise one or more of granules, spheroids, microspheres, ellipsoids, irregular spheroids, strands, flakes, powder, nanotubes, and/or a combination of any or all of these shapes. In addition, exemplary embodiments may also include different grades (e.g., different sizes, different purities, different shapes, etc.) of the same (or different) fillers.

In exemplary embodiments, the composite is compliant with ROHS Directive 2011/65/EU and (EU) 2015/863 and/or compliant with REACH as containing less than 0.1% by weight of substances on the REACH/SVHC candidate list (Jun. 25, 2020). In exemplary embodiments, the composite includes no more than a regulated threshold of 0.01% by weight of cadmium, no more than a regulated threshold of 0.1% by weight of Lead, no more than a regulated threshold of 0.1% by weight of mercury, no more than a regulated threshold of 0.1% by weight of hexavalent chromium, no more than a regulated threshold of 0.1% by weight of flame retardants PBB and PBDE including pentabromodiphenyl ether (CAS-No. 32534-81-9), octabromodiphenyl ether (CAS-No. 32536-52-0) and decabromodiphenyl ether (CAS-No. 1163-19-5), no more than a regulated threshold of 0.1% by weight of Bis(2-ethylhexyl) phthalate (DEHP) (CAS-No. 117-81-7), no more than a regulated threshold of 0.1% by weight of butyl benzyl phthalate (BBP) (CAS-No. 85-68-7), no more than a regulated threshold of 0.1% by weight of dibutyl phthalate (DBP) (CAS-No. 84-74-2), and no more than a regulated threshold of 0.1% by weight diisobutyl phthalate (DIBP) (CAS-No. 84-69-5).

Exemplary embodiments of the thermal and/or EMI management materials disclosed herein may be used in a wide range of industries (e.g., automotive, consumer, industrial, datacom/telecom, aerospace/defense, etc.) and wide range of applications (e.g., automotive electronics, automotive advanced driver-assistance systems (ADAS), automotive powertrain/electronic control units (ECUs), automotive infotainment, industrial power, routers, wireless infrastructure, drones/satellites, gaming systems, smart home devices, notebooks/tablets/portable devices, etc.).

In exemplary embodiments, the composite including silicone carbinol is a thermal interface material (TIM), such as a thermally-conductive pad, thermally-conductive gap filler, dispensable material, thermal grease, bulk putty, phase change TIM, etc. In exemplary embodiments, the composite including silicone carbinol is a thermal and/or EMI management material having a relatively high thermal conductivity (e.g., 1 W/mK (watts per meter per Kelvin), 1.1 W/mK, 1.2 W/mK, 2.8 W/mK, 3 W/mK, 3.1 W/mK, 3.8 W/mK, 4 W/mK, 4.7 W/mK, 5 W/mK, 5.4 W/mK, 6 W/mK, 8 W/mK, greater than 8 W/mK, etc.) depending on the particular materials used to make the thermal and/or EMI management material and loading percentage of the thermally conductive filler, if any. These thermal conductivities are only examples as other embodiments may include a thermal and/or EMI management material with a thermal conductivity higher than 8 W/mK, less than 1 W/mK (e.g., at least about 0.3 W/mK, etc.), or a value within a range from 1 W/mK to 8 W/mK.

In exemplary embodiments, a thermal and/or EMI management material (e.g., a thermal interface material, thermally-conductive EMI absorber, etc.) including silicone carbinol may be used to define or provide part of a thermally-conductive heat path from a heat source to a heat removal/dissipation structure or component. The thermal and/or EMI management material may be used, for example, to help conduct thermal energy (e.g., heat, etc.) away from a heat source of an electronic device. The thermal and/or EMI management material may be positionable generally between (e.g., directly against in physical contact with, in thermal contact with, etc.) a heat source and a heat removal/dissipation structure or component to establish a thermal joint, interface, pathway, or thermally-conductive heat path along which heat may be transferred (e.g., conducted) from the heat source to the heat removal/dissipation structure or component. During operation, the thermal and/or EMI management material may function to allow transfer of heat (e.g., to conduct heat, etc.) from the heat source along the thermally-conductive path to the heat removal/dissipation structure or component. In exemplary embodiments, the thermal and/or EMI management material may also be operable for mitigating EMI (e.g., absorbing EMI, etc.) incident upon the thermal and/or EMI management material.

Example embodiments disclosed herein may be used with a wide range of heat sources, electronic devices, and/or heat removal/dissipation structures or components (e.g., a heat spreader, a heat sink, a heat pipe, a vapor chamber, a device exterior case, housing, or chassis, etc.). For example, a heat source may comprise one or more heat generating components or devices, such as a high-power integrated circuit (IC), optical transceiver, 5G infrastructure devices (e.g., base stations, small cells, smart poles, etc.), memory in video cards, set top boxes, televisions, gaming systems, automotive electronics used for autonomous driving (ADAS) (e.g., radars, multi domain controllers, cameras, etc.), a CPU, die within underfill, semiconductor device, flip chip device, graphics processing unit (GPU), digital signal processor (DSP), multiprocessor system, integrated circuit (IC), multi-core processor, etc.). Generally, a heat source may comprise any component or device that has a higher temperature than the thermal and/or EMI management material or otherwise provides or transfers heat to the thermal and/or EMI management material regardless of whether the heat is generated by the heat source or merely transferred through or via the heat source. Accordingly, aspects of the present disclosure should not be limited to use with any single type of heat source, electronic device, heat removal/dissipation structure, etc.

Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. For example, when permissive phrases, such as "may comprise", "may include", and the like, are used herein, at least one embodiment comprises or includes the feature(s). As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances. Or for example, the term "about" as used herein when modifying a quantity of an ingredient or reactant of the invention or employed refers to variation in the numerical quantity that can happen through typical measuring and handling procedures used, for example, when making concentrates or solutions in the real world through inadvertent error in these procedures; through differences in the manufacture, source, or purity of the ingredients employed to make the compositions or carry out the methods; and the like. The term "about" also encompasses amounts that differ due to different equilibrium conditions for a composition resulting from a particular initial mixture. Whether or not modified by the term "about", equivalents to the quantities are included.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method comprising adding silicone carbinol to a composite in an amount sufficient for increasing flow rate of the composite and/or for decreasing migration of materials from the composite, wherein the composite is useful for the management of heat and/or electromagnetic interference (EMI), and wherein the silicone carbinol comprises hydrocarbyl functional organopolysiloxane that includes a hydrocarbyl group having the formula of $R^2OCH_2CH_2OH$ where $R^2$ is a divalent hydrocarbon group containing 2 to 6 carbon atoms.

2. The method of claim 1, wherein the method includes increasing the flow rate of the composite by adding the silicone carbinol to the composite, thereby enabling an increase in filler content in the composite for performance improvement.

3. The method of claim 1, wherein the method includes adding the silicone carbinol to the composite in an amount sufficient for both increasing the flow rate of the composite and decreasing migration of materials from the composite.

4. The method of claim 1, wherein the composite is a polydimethylsiloxane (PDMS)-based polymer-inorganic composite.

5. The method of claim 1, wherein adding the silicone carbinol to the composite comprises adding carbinol siloxane to the composite.

6. The method of claim 1, wherein adding the silicone carbinol to the composite comprises adding silicone carbinol fluid to the composite in an amount sufficient to act as an effective particle dispersant in the composite.

7. The method of claim 1, wherein the composite includes the silicone carbinol, aluminum, and zinc oxide within a matrix comprising polydimethylsiloxane (PDMS).

8. The method of claim 1, wherein the silicone carbinol comprises carbinol polysiloxane within a matrix comprising polydimethylsiloxane (PDMS) such that a ratio of the PDMS to the carbinol polysiloxane is about 3:3.1, about 2.5:3.6, or about 1:1 or less.

9. The method of claim 1, wherein the silicone carbinol comprises silicone monocarbinol and/or bicarbinol and/or dicarbinol within a matrix comprising polydimethylsiloxane (PDMS) such that a ratio of the PDMS to the silicone monocarbinol and/or bicarbinol and/or dicarbinol is about 3:3.1 or less.

10. The method of claim 1, wherein the silicone carbinol is in an amount sufficient to reduce silicone oil bleed from the composite thereby enabling the composite to be usable substantially or entirely without silicone migration beyond confines of the composite.

11. A method comprising adding silicone carbinol to a composite in an amount sufficient for increasing flow rate of the composite and/or for decreasing migration of materials from the composite, wherein the composite is useful for the management of heat and/or electromagnetic interference (EMI), and wherein the composite is a polymer-inorganic composite substantially free of siloxane polymers.

12. The method of claim 1, wherein:
- the composite has a mass flow rate of at least about 100 grams per minute (g/min) or higher; and/or
- the composite is deflectable to a minimum bondline of less than about 50 micrometers.

13. The method of claim 1, wherein:
- the composite is a liquid gap filler composite including silicone carbinol fluid and/or the composite is in the form of a gap filler pad; and/or
- the method includes dispensing the composite onto a surface of a device for managing thermal and/or electromagnetic properties of the device or a system including the device.

14. The method of claim 1, wherein:
- the composite comprises polydimethylsiloxane (PDMS) fluid; and
- adding the silicone carbinol to the composite comprises adding silicone carbinol fluid to the PDMS fluid in an amount sufficient to enable the silicone carbinol fluid to act as an effective particle dispersant in the composite.

15. The method of claim 1, wherein the method further comprises adding one or more of the following to the composite:
- thermally-conductive filler(s);
- electrically-conductive filler(s);
- electromagnetic wave absorbing filler(s);
- dielectric absorbing filler(s); and
- filler(s) that has two or more properties of being thermally conductive, electrically conductive, dielectric absorbing, and electromagnetic wave absorbing;
- whereby the composite is a thermal and/or electromagnetic interference (EMI) management material usable for managing thermal and/or electromagnetic properties of a device or system; and/or
- whereby the composite is a thermal interface material, an EMI absorber, a thermally-conductive absorber, an electrically-conductive elastomer, an electrically-conductive composite, or a combination of two or more thereof.

16. A composite useful for the management of heat and/or electromagnetic interference (EMI), the composite comprising silicone carbinol in an amount sufficient for increasing flow rate of the composite and/or for decreasing migration of materials from the composite, and wherein the silicone carbinol comprises hydrocarbyl functional organopolysiloxane that includes a hydrocarbyl group having the formula of $R^2OCH_2CH_2OH$ where $R^2$ is a divalent hydrocarbon group containing 2 to 6 carbon atoms.

17. The composite of claim 16, wherein the composite includes the silicone carbinol in an amount sufficient to increase the flow rate of the composite thereby enabling an increase in filler content in the composite for performance improvement.

18. The composite of claim 16, wherein the composite includes the silicone carbinol in an amount sufficient for both increasing the flow rate of the composite and decreasing migration of materials from the composite.

19. The composite of claim 16, wherein the composite further comprises one or more of the following:
- thermally-conductive filler(s);
- electrically-conductive filler(s);
- electromagnetic wave absorbing filler(s);
- dielectric absorbing filler(s); and
- filler(s) that has two or more properties of being thermally conductive, electrically conductive, dielectric absorbing, and electromagnetic wave absorbing;
- whereby the composite is a thermal and/or electromagnetic interference (EMI) management material usable for managing thermal and/or electromagnetic properties of a device or system; and/or
- whereby the composite is a thermal interface material, an EMI absorber, a thermally-conductive absorber, an electrically-conductive elastomer, an electrically-conductive composite, or a combination of two or more thereof.

20. The composite of claim 16, wherein the composite is a polydimethylsiloxane (PDMS)-based polymer-inorganic composite.

21. The composite of claim 16, wherein the silicone carbinol comprises carbinol polysiloxane within a matrix comprising polydimethylsiloxane (PDMS) such that a ratio of the PDMS to the carbinol polysiloxane is about 3:3.1, about 2.5:3.6, or about 1:1 or less.

22. The composite of claim 16, wherein the silicone carbinol comprises silicone monocarbinol and/or bicarbinol and/or dicarbinol within a matrix comprising polydimethylsiloxane (PDMS) such that a ratio of the PDMS to the silicone monocarbinol and/or bicarbinol and/or dicarbinol is about 3:3.1 or less.

23. The composite of claim 16, wherein the silicone carbinol is in an amount sufficient to reduce silicone oil bleed from the composite thereby enabling the composite to be usable substantially or entirely without silicone migration beyond confines of the composite.

* * * * *